US008023303B2

(12) United States Patent
Echigoya et al.

(10) Patent No.: US 8,023,303 B2
(45) Date of Patent: Sep. 20, 2011

(54) SEMICONDUCTOR MEMORY DEVICE AND MEMORY ACCESS METHOD

(75) Inventors: Kenichi Echigoya, Tokyo (JP); Hisayuki Nagamine, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 112 days.

(21) Appl. No.: 12/458,334

(22) Filed: Jul. 8, 2009

(65) Prior Publication Data

US 2010/0014339 A1    Jan. 21, 2010

(30) Foreign Application Priority Data

Jul. 16, 2008    (JP) ................................ P2008-184974

(51) Int. Cl.
*G11C 5/02* (2006.01)
(52) U.S. Cl. .......................................... 365/51; 365/205
(58) Field of Classification Search .................... 365/51, 365/205
See application file for complete search history.

(56) References Cited

U.S. PATENT DOCUMENTS

| | | | | |
|---|---|---|---|---|
| 4,695,864 A * | 9/1987 | Kawamoto | ................... | 257/297 |
| 5,301,142 A * | 4/1994 | Suzuki et al. | ................... | 365/51 |
| 5,970,003 A * | 10/1999 | Miyatake et al. | ............. | 365/200 |
| 6,175,516 B1 * | 1/2001 | Kitsukawa et al. | ............. | 365/63 |
| 6,373,776 B2 * | 4/2002 | Fujisawa et al. | ......... | 365/230.03 |
| 6,657,882 B2 * | 12/2003 | Takashima | ................... | 365/145 |
| 6,809,946 B2 * | 10/2004 | Fujisawa et al. | ................ | 365/51 |
| 2001/0028593 A1 * | 10/2001 | Sekiguchi et al. | ....... | 365/230.03 |

FOREIGN PATENT DOCUMENTS

JP    2000-49305    2/2000

* cited by examiner

*Primary Examiner* — Michael Tran
(74) *Attorney, Agent, or Firm* — McGinn IP Law Group, PLLC

(57) ABSTRACT

A semiconductor memory device includes: first and second memory mats; first and second local input output lines coupled to the first memory mat via a first amplifier circuit; third and fourth local input output lines different from the first and second local input output lines, third and fourth local input output lines coupled to the second memory mat via a second amplifier circuit; a third amplifier circuit coupled between the first local input output line and a first main input output line; a fourth amplifier circuit coupled between the third local input output line and a second main input output line different from the first main input output line; and a first switch coupled between the second and third local input output lines and connecting the second local input output line to the fourth amplifier circuit when the first memory mat is activated and the second memory mat is not activated.

18 Claims, 6 Drawing Sheets

SEMICONDUCTOR MEMORY DEVICE AND MEMORY ACCESS METHOD

BACKGROUND OF THE INVENTION

1. Field of the Invention

The present invention relates to a semiconductor memory device that simultaneously accesses multiple bits of data and a memory access method for the semiconductor memory device.

Priority is claimed on Japanese Patent Application No. 2008-184974, filed Jul. 16, 2008, the content of which is incorporated herein by reference.

2. Description of the Related Art

Generally, a semiconductor memory device includes: memory cells arranged in a matrix; multiple Mats (memory cell mats) arranged in a matrix, each of which includes multiple memory cells; multiple SAs (first amplifier circuits) connected to the memory cells through bit lines; and multiple DA/WAs (second amplifier circuits) connected to the SAs through LIOs (local input/output lines).

Each DA/WA is connected to an external terminal through an MIO (main input/output line), and includes: a DA (reading circuit) that reads out data from a memory cell, amplifies the read data, and outputs the amplified data; and a WA (writing circuit) that amplifies input data and writes the amplified data to a memory cell.

To reduce the area of a semiconductor chip, some semiconductor memory devices are configured to include DA/WA at a region where an SWD (subword driver) row including SWDs that drive subword lines connected to memory cells included in each Mat crosses an ST (first amplifier circuit column) including multiple SAs, as shown in FIG. 5.

An ST includes SAs, DA/WAs, and SWC2s (power supply circuit) arranged in series in the vertical direction. The SWD row extends in a direction parallel to bit lines (horizontal direction). An ST extends in a direction parallel to LIOs (vertical direction).

Hereinafter, the case where the semiconductor memory device reads out data from a memory cell by one operation of data inputting/outputting (memory access) is explained with reference to FIG. 6.

Based on a row address of an input address, one of MTs (memory cell mat columns) extending in a direction parallel to LIOs (vertical direction) is activated by an XDEC (X decoder) (not shown), and the remaining MTs are inactivated.

Assuming that MT1 shown in FIG. 6 is selected, data stored in memory cells included in the activated MT1 are output to the corresponding SAs through bit lines connecting the memory cells and the corresponding SAs, and thereby STs are activated. In this case, data are output from MT1 to both ST1 (provided on the left side of MT1) and ST2 (provided on the right side of MT1), and thereby ST1 and ST2 are activated.

Then, a YDEC (Y decoder) turns on a Y switch (not shown) based on a column address of the input address, and thereby data are output from an SA connected to one side of the Y switch to an LIO connected to the other side of the Y switch.

In this case, it is assumed that 4 bits of data are output from respective four cells included in MT1. Specifically, two bits of data are output toward the right side and the remaining 2 bits of data are output toward the left side.

Then, each DA/WA amplifies the data read out to the connected LIO and outputs the amplified data to a corresponding MIO. In this case, each of DA/WA1 to DA/WA4 outputs 1 bit of data, i.e., total 4 bits of data are output from DA/WA1 to DA/WA4 through MIO1 to MIO4.

As explained above, the amount of data to be input/output by one operation of inputting/outputting, i.e., one memory access is limited in the semiconductor memory device shown in FIG. 6. In other words, the number of MIOs is limited according to the number of DA/WAs included in each ST. Specifically, the number of MIOs is twice that of DA/WAs included in each ST.

This is because STn and ST(n+1) which are on both sides of MTn are activated by one operation of data inputting/outputting, and then data are output from MTn to DA/WAn and DA/WA(n+2) included in STn, and DA/WA(n+1) and DA/WA(n+3) included in ST(n+1).

Therefore, faster writing/reading of data to/from the semiconductor memory device can be implemented by increasing the number of DA/WAs included in one ST so that the number of MIOs and the number of bits to be simultaneously read out increase.

However, the area of a region where an ST crosses an SWD row, i.e., the region where a DA/WA is provided, is limited. In other words, the number of DA/WAs that can be provided in the region is limited depending on the area of the region.

For this reason, when the number of MIOs is increased in the semiconductor device shown in FIG. 6, it is necessary to increase the division number of memory cell mats, i.e., the number of regions where STs cross SWD rows, i.e., regions where DA/WAs are provided.

As a method of increasing the number of MIOs included in a semiconductor memory device, Japanese Unexamined Patent, First Publication No. 2000-49305 discloses a configuration in which DA/WAs are provided outside of a memory cell matrix.

However, the increase in the number of regions where DA/WAs are provided causes an increase in the area of a semiconductor chip.

Additionally, in the configuration disclosed in Japanese Unexamined Patent, First Publication No. 2000-49305, a DA/WA is provided outside of the memory cell matrix, not in a region where an ST crosses an SWD row, thereby making a semiconductor chip larger than in the configuration in which a DA/WA is provided in a region where an ST crosses an SWD row. Further, the number of DA/WAs to be provided outside of the memory cell matrix increases as the number of MIOs increases, thereby increasing the area of the semiconductor chip.

SUMMARY

In one embodiment, there is provided a semiconductor memory device including: a plurality of memory mat groups each including a plurality of memory mats arranged in a first direction, the plurality of memory mats each including a plurality of memory cells, and each of the plurality of memory cells coupled to corresponding one of bit lines; a plurality of amplifier groups each arranged adjacently between corresponding two of the memory mat groups and arranged along the first direction, the plurality of amplifier groups including a first amplifier group, a second amplifier group, and a third amplifier group, each of the first and second amplifier groups arranged adjacent to one of the memory mat groups and the third amplifier group without being arranged adjacent to the one of the memory mat groups; a plurality of first amplifier circuits each provided in a corresponding one of the amplifier groups and coupled to corresponding one or ones of the bit lines; and a plurality of second amplifier circuits each provided in a corresponding one of the amplifier groups and coupled to corresponding one or ones of the first amplifier circuits included in the amplifier group therein. One of the second amplifier circuits included in the third amplifier group is coupled to a corresponding one of the first amplifier circuits included in the first amplifier group.

In another embodiment, there is provided a semiconductor memory device comprising: first and second memory mats; first and second local input output lines coupled to the first memory mat via a first amplifier circuit; third and fourth local input output lines different from the first and second local input output lines, third and fourth local input output lines coupled to the second memory mat via a second amplifier circuit; a third amplifier circuit coupled between the first local input output line and a first main input output line; a fourth amplifier circuit coupled between the third local input output line and a second main input output line different from the first main input output line; and a first switch coupled between the second and third local input output lines and connecting the second local input output line to the fourth amplifier circuit when the first memory mat is activated and the second memory mat is not activated.

In another embodiment, there is provided a controlling method for a semiconductor memory device. The controlling method includes: activating a first memory mat without activating a second memory mat different from the first memory mat; activating a first amplifier circuit provided corresponding to the first memory mat; activating a second amplifier circuit provided corresponding to the first amplifier circuit to amplify one or ones of predetermined number of data from the first memory mat; and activating a fourth amplifier circuit provided corresponding to a third amplifier circuit which is provided corresponding to the second memory mat, the fourth amplifier circuit amplifying a remaining of the predetermined number of data from the first memory mat.

Accordingly, the second amplifier circuits that are not activated and therefore not used in the conventional case are used for data inputting/outputting in the embodiment. Therefore, the number of bits to be simultaneously output can be increased without newly compartmentalizing the semiconductor memory device with the greater division number to increase the number of second amplifier circuits as in the conventional case which causes an increase in the area of the semiconductor chip.

Additionally, the number of operation circuits does not increase since another compartmentalization of the semiconductor memory device is unnecessary. Therefore, an increase in consumption currents does not occur as in the conventional case.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated herein for explanatory purposes.

When Mat1 is selected in the conventional case, only ST1 and ST2 which are on both sides of Mat1 are activated and used for data amplification, and other STs which are not adjacent to the selected Mat1 are inactivated.

In the present invention, DW/WAs included in the inactivated STs not adjacent to the selected Mat is also activated to be used for amplifying data output from the selected Mat, thereby increasing the number of bits to be read out at one access.

In other words, when a semiconductor memory device of the present invention including multiple Mats reads/writes data from/to a memory cell, one of multiple MTs is selected. Then, not only DW/DAs included in the STs adjacent to the selected MT, but also DW/DAs included in other STs not adjacent to the selected MT are used.

In this case, predetermined combinations of STs (two in the cases of the following embodiments) which are connected to each other through LIO bypass wires (which are explained later) are simultaneously activated for data amplification.

Thereby, the number of memory cells which are included in the selected MT and from which data are simultaneously read out, i.e., the number of MIOs can easily be increased without increasing the area of the semiconductor chip.

Figure 1:
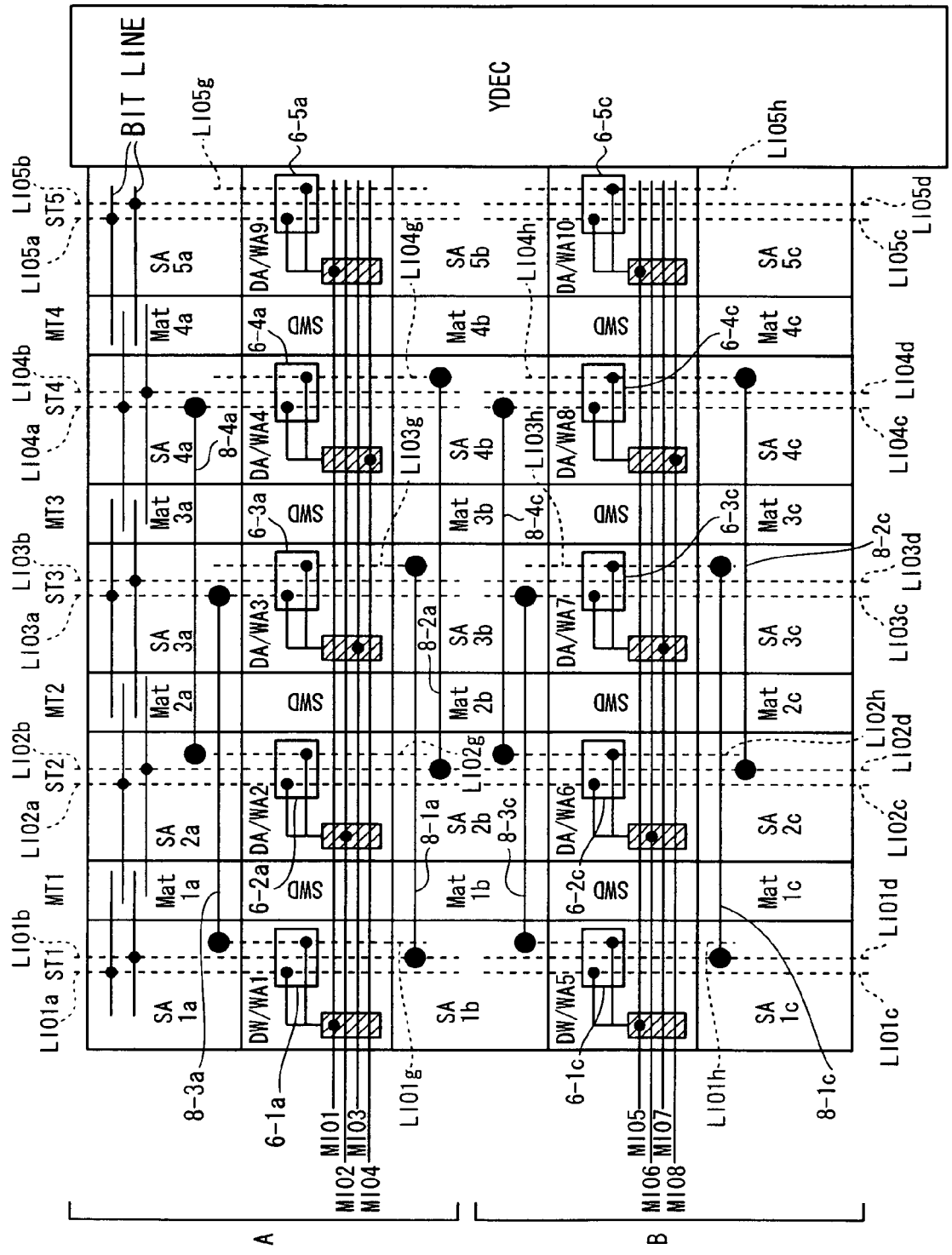
FIG. 1 illustrates a memory cell region of a semiconductor memory device according to a first embodiment of the present invention.

Hereinafter, explanations will be given with a semiconductor memory device including Mats provided in a matrix each including memory cells in a matrix taken as an example, as shown in FIG. 1. However, the present invention is not limited thereto, and applicable to a semiconductor memory device which includes multiple DA/WAs connected in parallel to one MIO and has a configuration such that some of DA/WAs are used and the remaining DA/WAs are not used upon memory access.

First Embodiment

Figure 5:
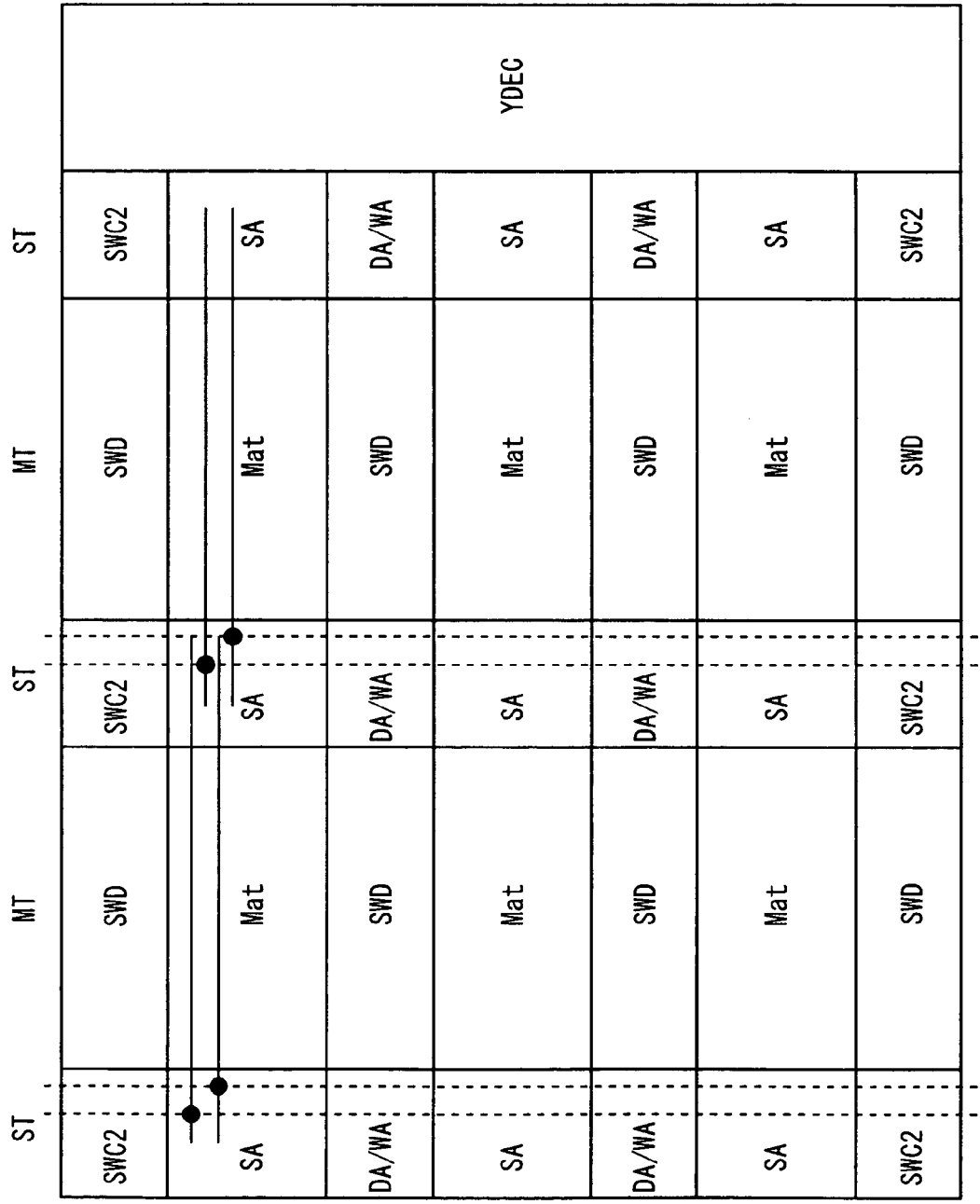
FIG. 5 illustrates a memory cell region of a general semiconductor memory device.

FIG. 1 illustrates the configuration of a semiconductor memory device according to a first embodiment of the present invention. Like reference numerals denote like units shown in FIG. 6, and explanations thereof are omitted. SWC2 shown in FIG. 5 is also omitted.

The semiconductor memory device according to the first embodiment is, for example, DRAM (Dynamic Random Access Memory) and includes a memory cell region including multiple memory cells provided in a matrix. The memory cell region (each of banks if the memory cell region is divided into multiple banks) is segmented into multiple memory cell mats, Mat1a, Mat1b, Mat1c, . . . , Mat4a, Mat4b, and Mat4c. Each Mat includes multiple memory cells provided in a matrix.

Each memory cell included in each Mat is selected by an input address (row and column addresses). Data output from the memory cell are sequentially amplified by an SA and a DA/WA, and then output through an MIO. In this case, a YDEC (Y decoder) selects a bit line using a column address. An XDEC (X decoder) selects a Mat and a word line (subword line) included in the selected Mat using a row address, and then activates the selected word line. Thus, a memory cell is selected.

The memory cells included in each Mat are connected to SAs through bit lines. Mats and SWDs are alternately aligned in an MT. SAs are provided on both sides of a Mat. DA/WAs are provided on both sides of an SWD. In other words, a column including Mats and SWDs and a column including SAs and DA/WAs are parallel and adjacent to each other.

A DA/WA is connected to an SA through LIO. A DA/WA amplifies data read from a memory cell included in an SA through an LIO, and outputs the amplified data to the external terminal through an MIO.

SA1a and SA2a are provided on the left and right sides of the Mat1a, respectively. SA1b and SA2b are provided on the left and right sides of the Mat1b, respectively. SA1c and SA2c are provided on the left and right sides of the Mat1c, respectively.

Similarly, SA2a and SA3a are provided on the left and right sides of the Mat2a, respectively. SA2b and SA3b are provided on the left and right sides of the Mat2b, respectively. SA2c and SA3c are provided on the left and right sides of the Mat2c, respectively.

Additionally, SA3a and SA4a are provided on the left and right sides of the Mat3a, respectively. SA3b and SA4b are provided on the left and right sides of Mat3b, respectively. SA3c and SA4c are provided on the left and right sides of Mat3c, respectively.

Further, SA4a and SA5a are provided on the left and right sides of the Mat4a, respectively. SA4b and SA5b are provided on the left and right sides of Mat4b, respectively. SA4c and SA5c are provided on the left and right sides of Mat4c, respectively.

Each of SA1a to SA1c, SA2a to SA2c, SA3a to SA3c, SA4a to SA4c, and SA5a to SA5c includes multiple first amplifier circuits.

MT1 includes Mat 1a, Mat 1b, and Mat 1c. MT2 includes Mat 2a, Mat 2b, and Mat 2c. MT3 includes Mat 3a, Mat 3b, and Mat 3c. MT4 includes Mat 4a, Mat 4b, and Mat 4c.

ST1 includes SA1a, SA1b, and SA1c. ST2 includes SA2a, SA2b, and SA2c. ST3 includes SA3a, SA3b, and SA3c. ST4 includes SA4a, SA4b, and SA4c. ST5 includes SA5a, SA5b, and SA5c.

Each MT is divided into two groups A and B. MIO1, MIO2, MIO3, and MIO4 are provided in the group A. MIO5, MIO6, MIO7, and MIO8 are provided in the group B. Thus, the total number of 8 MIOs is provided.

The group A includes: Mat1a and a half of Mat1b on the side of Mat1a; Mat2a and a half of Mat2b on the side of Mat2a; Mat3a and a half of Mat3b on the side of Mat3a; and Mat4a and a half of Mat4b on the side of Mat4a.

The group B includes: Mat1c and a half of Mat1b on the side of Mat1c; Mat2c and a half of Mat2b on the side of Mat2c; Mat3c and a half of Mat3b on the side of Mat3c; and Mat4c and a half of Mat4b on the side of Mat4c.

Hereinafter, the configuration of LIOs is explained. Each STn (n=1, 2, 3, 4, 5) includes three LIOs of LIOna, LIOnb, and LIOng which are included in the group A and three LIOs of LIOnc, LIOnd, and LIOnh which are included in the group B. Those LIOs extend in the vertical direction.

A pair of LIOna and LIOnb and a pair of LIOnc and LIOnd are connected to SAs included in STn. On the other hand, LIOng and LIOnh are extending from LIO bypass wires which will be explained later. Thus, LIOs provided in the group A are separated from LIOs provided in the group B (i.e., LIOs are severed between the groups A and B).

In the group A, ST1 includes LIO1a, LIO1b, and LIO1g. ST2 includes LIO2a, LIO2b, and LIO2g. ST3 includes LIO3a, LIO3b, and LIO3g. ST4 includes LIO4a, LIO4b, and LIO4g. ST5 includes LIO5a, LIO5b, and LIO5g.

In the group B, ST1 includes LIO1c, LIO1d, and LIO1h. ST2 includes LIO2c, LIO2d, and LIO2h. ST3 includes LIO3c, LIO3d, and LIO3h. ST4 includes LIO4c, LIO4d, and LIO4h. ST5 includes LIO5c, LIO5d, and LIO5h.

As explained above, LIOs provided in the group A are separated from LIOs provided in the group B as shown in FIG. 1. Thereby, the number of LIOs to be used for one operation of data inputting/outputting can be increased compared to the conventional semiconductor memory device. Additionally, additional capacity of outputs from the Y switch decreases compared to the conventional case, thereby enabling faster operation.

Predetermined one of two LIOs included in STn is connected through an LIO bypass wire to DA/WA(n+2) included in ST(n+2). Specifically, in the group A, LIO1b included in ST1 is connected through an LIO bypass wire 8-1a to LIO3g included in ST3. Similarly, LIO2b included in ST2 is connected through an LIO bypass wire 8-2a to LIO4g included in ST4. LIO3a included in ST3 is connected through an LIO bypass wire 8-3a to LIO1g included in ST1. LIO4a included in ST4 is connected through an LIO bypass wire 8-4a to LIO2g included in ST2.

On the other hand, in the group B, LIO1d included in ST1 is connected through an LIO bypass wire 8-1c to LIO3h included in ST3. Similarly, LIO2d included in ST2 is connected through an LIO bypass wire 8-2c to LIO4h included in ST4. LIO3c included in ST3 is connected through an LIO bypass wire 8-3c to LIO1h included in ST1. LIO4c included in ST4 is connected through an LIO bypass wire 8-4c to LIO2h included in ST2.

The above configuration of groups A and B is just an example, and an SA and a DA/WA which are connected to each other through an LIO bypass wire may be further distanced from each other.

As explained above, each DA/WA included in STn is connected to LIOs included in STn, and to an LIO included in ST(n+2) through an LIO bypass wire. Specifically, DA/WA1 is connected to LIO1a connected to SA1a, and to LIO1g connected to SA3a through the LIO bypass wire 8-3a and LIO3a.

LIO1g, LIO2g, LIO3g, LIO4g, LIO1h, LIO2h, LIO3h, and LIO4h are LIOs extending from LIO bypass wires 8-3a, 8-4a, 8-1a, 8-2a, 8-3c, 8-4c, 8-1c, and 8-2c, respectively.

An LIO switching circuit 6-1a is provided in the region where DA/WA1 is provided and selects any one of LIO1a and LIO1g to switch LIO to which data amplified by DA/WA1 is to be input. Similarly, an LIO switching circuit 6-2a, an LIO switching circuit 6-3a, an LIO switching circuit 6-4a, an LIO switching circuit 6-1c, an LIO switching circuit 6-2c, an LIO switching circuit 6-3c, and an LIO switching circuit 6-4c are provided in the regions where DA/WA2, DA/WA3, DA/WA4, DA/WA5, DA/WA6, DA/WA7, and DA/WA8 are provided, respectively.

MIO1 to MIO4 included in the group A are provided in one SWD row. MIO5 to MIO8 included in the group B are provided in one SWD row.

The LIO bypass wire 8-3a is formed by extending an LIO connected to DA/WA3 included in ST3 toward a memory region, extending an LIO connected to DA/WA1 toward the memory region, and connecting the extended LIOs in the memory region. The other bypass wires are formed in a similar manner. Thereby, the LIO bypass wires can be provided without increasing the areas of SWDs.

Figure 2:
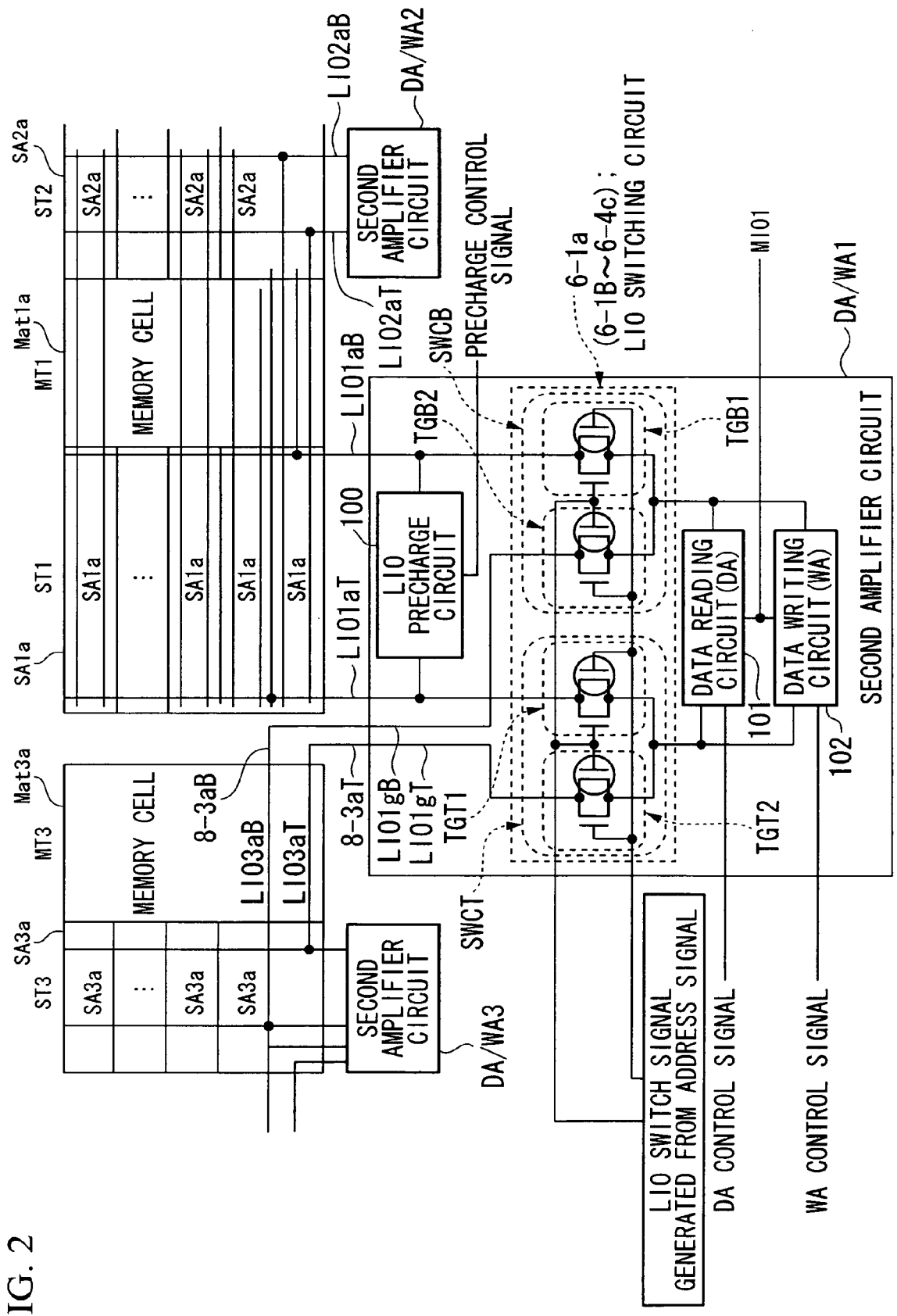
FIG. 2 illustrates the configuration of an LIO switching circuit shown in FIG. 1.

Hereinafter, the LIO switching circuits (6-1*a* to 6-4*c*) shown in FIG. 1 are explained with reference to FIG. 2. FIG. 2 illustrates the configuration of a DA/WA including the LIO switching circuit. Although the LIO switching circuit 6-1*a* included in DA/WA1 is explained hereinafter as an example, the LIO switching circuits 6-2*a* to 6-4*c* have the same inner configuration as that of LIO switching circuit 6-1*a* except for that connected LIOs differ.

If a DA control signal based on a reading control signal is input, a data reading circuit DA is activated and a reading process is carried out. If a WA control signal based on a writing control signal is input, a data writing circuit WA is activated and a writing process is carried out.

As explained above, the LIO switching circuit 6-1*a* selects any one of LIO1*a* and LIO1*g* which are connected to DA/WA1 in order to switch LIO to which data to be amplified by DA/WA1 is to be input.

As shown in FIG. 2, LIO1*a*T and LIO1*a*B which are connected to a predetermined first amplifier circuit included in SA1*a* included in ST1 are connected to the LIO switching circuit 6-1*a*. LIO1*g*T and LIO1*g*B to which data are input through the LIO bypass wire 8-3*a* from a predetermined first amplifier circuit included in SA3*a* included in ST3 are also connected to the LIO switching circuit 6-1*a*.

LIO1*g*T and LIO1*g*B correspond to LIO3*a*T and LIO3*a*B, respectively. The LIO bypass wire 8-3*a* includes LIO bypass wires 8-3*a*T and 8-3*a*B which have the complementary relationship with each other. The LIO bypass wires 8-3*a*T and 8-3*a*B correspond to LIO1*g*T and LIO*g*B connected to SA1*a*, respectively.

LIO1*a*T and LIO1*a*B have the complementary relationship with each other. LIO1*g*T and LIO1*g*B have the complementary relationship with each other. LIO3*g*T and LIO3*g*B have the complementary relationship with each other.

Although each of LIO1*a* to LIO4*h* is illustrated as one wire in FIG. 1, the complementary two LIOs are output from each SA as explained in FIG. 2. For example, LIO1*a* shown in FIG. 1 includes the two complementary LIOs of LIO1*a*T and LIO1*a*B. Similarly, each of LIO1*b* to LIO4*h* includes two complementary LIOs.

Similarly, each of the LIO bypass wires includes two complementary wires. For example, the LIO bypass wire 8-3*a* includes complementary LIO bypass wires 8-3*a*T and 8-3*a*B.

LIO3*a*T is connected to LIO1*a*T through the LIO bypass wire 8-3*a*T. The LIO3*a*B is connected to LIO1*a*B through the LIO bypass wire 8-3*a*B. The same can apply to the relationships between the other LIOs and LIO bypass wires.

DA/WA1 is a data reading/writing circuit that amplifies data read from a memory cell or data to be written into a memory cell upon reading/writing of data, and includes the LIO switching circuit 6-1*a*, the LIO precharge circuit 100, a data reading circuit 101, and a data writing circuit 102.

The LIO precharge circuit 100 precharges LIO1*a*T and LIO1*a*B. A precharge circuit for LIO3*a*T and LIO3*a*B is provided in DA/WA3.

The LIO switching circuit 6-1*a* includes two switching circuits SWCT and SWCB. SWCT selects any one of LIO1*a*T and LIO1*g*T to be connected to DA/WA1. SWCB selects any one of LIO1*a* and LIO1*g*B to be connected to DA/WA1.

SWCT includes TGT1 (a transfer gate of a MOS transistor) and TGT2. LIO1*a*T from MT1 is connected to a terminal (for example, a drain) of TGT1. LIO3*a*T from MT3 is connected to a terminal (for example, a drain) of TGT2. The other terminals of TGT1 and TGT2 (for example, sources) are connected to each other and to the data reading circuit 101 and data writing circuit 102. Any one of outputs from TGT1 and TGT2 is input to the data reading circuit 101 and the data writing circuit 102. TGT1 and TGT2 complementarily operate.

SWCB includes TGB1 (a transfer gate of a MOS transistor) and TGB2. LIO1*a*B from MT1 is connected to a terminal (for example, a drain) of TGB1. LIO3*a*B from MT3 is connected to a terminal (for example, a drain) of TGB2. The other terminals of TGB1 and TGB2 (for example, sources) are connected to each other and to the data reading circuit 101 and data writing circuit 102. Any one of outputs from TGB1 and TGB2 is input to the data reading circuit 101 and the data writing circuit 102. TGB1 and TGB2 complementarily operate.

Each of TGT1 and TGT2 is controlled based on an LIO switch signal generated based on a row address (X address signal) of an input address signal. In other words, a switch control circuit (not shown) generates an LIO control signal based on a row address for selecting one of MTs.

Specifically, if MT1 is selected, the switch control circuit generates an LIO switch signal for changing TGT1 and TGB1 to the on-state and TGT2 and TGB2 to the off-state. On the other hand, if MT3 is selected, the switch control circuit generates an LIO switch signal for changing TGT1 and TGB1 to the off-state and TGT2 and TGB2 to the on-state.

Consequently, the LIO switching circuit 6 selects one of two LIOs connected to DA/WA based on an input row address in order to switch LIO to which data to be amplified by the data reading circuit 101 or the data writing circuit 102 is to be input.

Hereinafter, one operation of data inputting/writing performed by the semiconductor memory device according to the first embodiment is explained with reference to FIG. 1. The case where data read from a memory cell is output from the semiconductor memory device is taken as an example.

One of MTs including multiple Mats provided in the direction parallel to LIOs is activated and the other MTs are inactivated by an XDEC (not shown) based on an input row address. The case where MT1 shown in FIG. 1 is selected by a row address is explained as an example, hereinafter.

Then, data are output from memory cells included in the activated MT1 to corresponding SAs included in ST1 and ST2 through bit lines connecting the memory cells and the corresponding SAs, thus ST1 and ST2 are activated. At this time, SAs included in ST3 are not activated.

Figure 6:
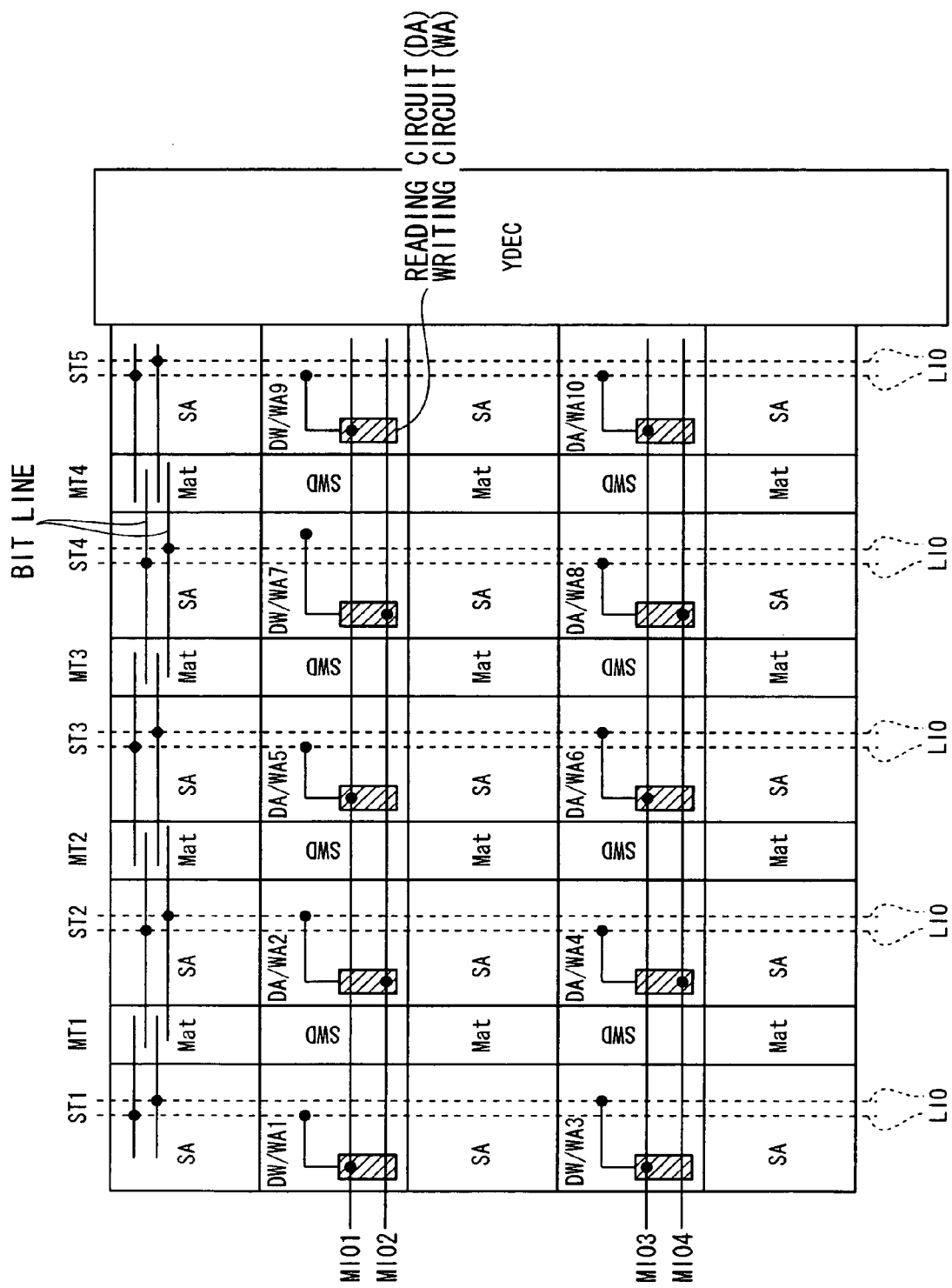
FIG. 6 illustrates a memory cell region of a conventional semiconductor memory device.

In this case, data are output from MT1 to both ST1 and ST2 (the process so far does not differ from that performed by the conventional semiconductor memory device shown in FIG. 6).

Then, the YDEC turns on a Y switch (not shown) based on an input column address, thus data from the bit line specified by the column address is output to an LIO through a predetermined SA.

In the present embodiment, 2 bits of data are output from the right side of Mat1*a* included in MT1. Additionally, 2 bits of data are output from the left side of Mat1*a*. Similarly, 2 bits of data are output from the right side of Mat1*c* included in MT1. Additionally, 2 bits of data are output from the left side of Mat1*c*. Thus, the total 8 bits of data are output from Mat1*a* and Mat1*c*.

In other words, one of 2 bits of data output from Mat1*a* to the SA included in SA1*a* included in ST1 is input to DA/WA1 through LIO1*a*.

Then, data input from LIO1*a* selected by the LIO switching circuit 6-1*a* is amplified by the data reading circuit 101 included in DA/WA1, and then output to the outside of the semiconductor memory device through MIO1.

In this case, the switch control circuit generates, for the LIO switching circuit 6-1*a*, an LIO switch signal for changing TGT1 and TGB1 to the on-state and TGT2 and TGB2 to the off-state since MT1 has been selected.

On the other hand, the other one of 2 bit of data output from Mat1*a* to an SA included in SA1*a* included in ST1 is input to DA/WA3 included in ST3 through LIO1*b*, the LIO bypass wire 8-1*a*, and LIO3*g*.

Then, data input from LIO3*g* selected by the LIO switching circuit 6-3*a* is amplified by the data reading circuit 101 included in DA/WA3, and then output to the outside of the semiconductor memory device through MIO3.

In this case, the switch control circuit generates, for the LIO switching circuit 6-3*a*, an LIO switch signal for changing TGT1 and TGB1 to the off-state and TGT2 and TGB2 to the on-state since MT1 has been selected.

Similarly, one of 2 bit of data output from Mat1*a* to an SA included in SA2*a* included in ST2 is input to DA/WA2 included in ST2 through LIO2*a*.

Then, data input from LIO2*a* selected by the LIO switching circuit 6-2*a* is amplified by the data reading circuit 101 included in DA/WA2, and then output to the outside of the semiconductor memory device through MIO2.

In this case, the switch control circuit generates, for the LIO switching circuit 6-2*a*, an LIO switch signal for changing TGT1 and TGB1 to the on-state and TGT2 and TGB2 to the off-state since MT1 has been selected.

On the other hand, the other one of 2 bit of data output from Mat1*a* to an SA included in SA2*a* included in ST2 is input to DA/WA4 included in ST4 through LIO2*b*, the LIO bypass wire 8-2*a*, and LIO4*g*.

Then, data input from LIO4*g* selected by the LIO switching circuit 6-4*a* is amplified by the data reading circuit 101 included in DA/WA4, and then output to the outside of the semiconductor memory device through MIO4.

In this case, the switch control circuit generates, for the LIO switching circuit 6-4*a*, an LIO switch signal for changing TGT1 and TGB1 to the off-state and TGT2 and TGB2 to the on-state since MT1 has been selected.

Further, one of 2 bits of data output from Mat1*c* to an SA included in SA1*c* included in ST1 is input to DA/WA5 through LIO1*c*.

Then, data input from LIO1*c* selected by the LIO switching circuit 6-1*c* is amplified by the data reading circuit 101 included in DA/WA5, and then output to the outside of the semiconductor memory device through MIO5.

In this case, the switch control circuit generates, for the LIO switching circuit 6-1*c*, an LIO switch signal for changing TGT1 and TGB1 to the on-state and TGT2 and TGB2 to the off-state since MT1 has been selected.

On the other hand, the other one of 2 bit of data output from Mat1*c* to an SA included in SA1*c* included in ST1 is input to DA/WA7 included in ST3 through LIO1*d*, the LIO bypass wire 8-1*c*, and LIO3*h*.

Then, data input from LIO3*h* selected by the LIO switching circuit 6-3*c* is amplified by the data reading circuit 101 included in DA/WA7, and then output to the outside of the semiconductor memory device through MIO7.

In this case, the switch control circuit generates, for the LIO switching circuit 6-3*c*, an LIO switch signal for changing TGT1 and TGB1 to the off-state and TGT2 and TGB2 to the on-state since MT1 has been selected.

Similarly, one of 2 bit of data output from Mat1*c* to an SA included in SA2*c* included in ST2 is input to DA/WA6 included in ST2 through LIO2*c*.

Then, data input from LIO2*c* selected by the LIO switching circuit 6-2*c* is amplified by the data reading circuit 101 included in DA/WA6, and then output to the outside of the semiconductor memory device through MIO6.

In this case, the switch control circuit generates, for the LIO switching circuit 6-2*c*, an LIO switch signal for changing TGT1 and TGB1 to the on-state and TGT2 and TGB2 to the off-state since MT1 has been selected.

On the other hand, the other one of 2 bit of data output from Mat1*c* to an SA included in SA2*c* included in ST2 is input to DA/WA8 included in ST4 through LIO2*d*, the LIO bypass wire 8-2*c*, and LIO4*h*.

Then, data input from LIO4*h* selected by the LIO switching circuit 6-4*c* is amplified by the data reading circuit 101 included in DA/WA8, and then output to the outside of the semiconductor memory device through MIO8.

In this case, the switch control circuit generates, for the LIO switching circuit 6-4*c*, an LIO switch signal for changing TGT1 and TGB1 to the off-state and TGT2 and TGB2 to the on-state since MT1 has been selected.

Thus, the semiconductor memory device according to the first embodiment can output 8 bits of data by one operation of data inputting/outputting.

As explained above, in the semiconductor memory device according to the first embodiment, the amount of data to be simultaneously input/output, i.e., the number of MIOs can be set to be four times the number of DA/WAs included in each ST.

DA/WAs that are not adjacent to the selected MT and therefore not activated for use in the conventional case are activated in the semiconductor memory device of the first embodiment by data being input from the activated ST to the inactivated DA/WAs through LIO bypass wires, thereby implementing the above configuration.

As a result, the amount of data to be simultaneously output (i.e., the number of MIOs) can be increased without increasing the division number of memory cell matrix and adding DA/WAs as in the conventional case.

Although the case where data are output from four memory cells included in each of Mat1*a* and Mat1*c* included in MT1 has been explained above, a memory cell included in Mat1*b* may be selected by the YDEC. In this case, LIO1*a* and LIO1*b*, or LIO1*c* and LIO1*d* are used.

At this time, it is necessary to prevent data output from memory cells included in Mat1*b* from colliding with data output from memory cells included in Mat1*a* or Mat1*c*. For this reason, the YDEC is prevented from selecting memory cells from which data are simultaneously output to the same LIO.

Specifically, MTs are divided into the groups A and B, and accordingly LIOs are severed between the groups A and B. When a predetermined SA included in SA1*b* is connected to LIO1*a*, data output from a memory cell included in SA1*a* might collide with data output from a memory cell included in SA1*b*.

For this reason, an LIO to which data is output from SA1*b* needs to be determined in accordance with operation in the groups A and B. In this case, a Y switch that controls connections between SAs included in SA1*b* and LIOs is provided in each of the groups A and B so that half of the data output from SA1*b* is input to LIO1*a* and the other half of the data is input to LIO1*c* based on control by the Y switch using a predetermined column address. Similarly, half of the data output from SA1*b* is input to LIO1*b* and the other half of the data is input to LIO1*d* based on control by the Y switch. The same can be applied to SA2*b*, SA3*b*, SA4*b*, and SA5*b*.

Second Embodiment

Figure 3:
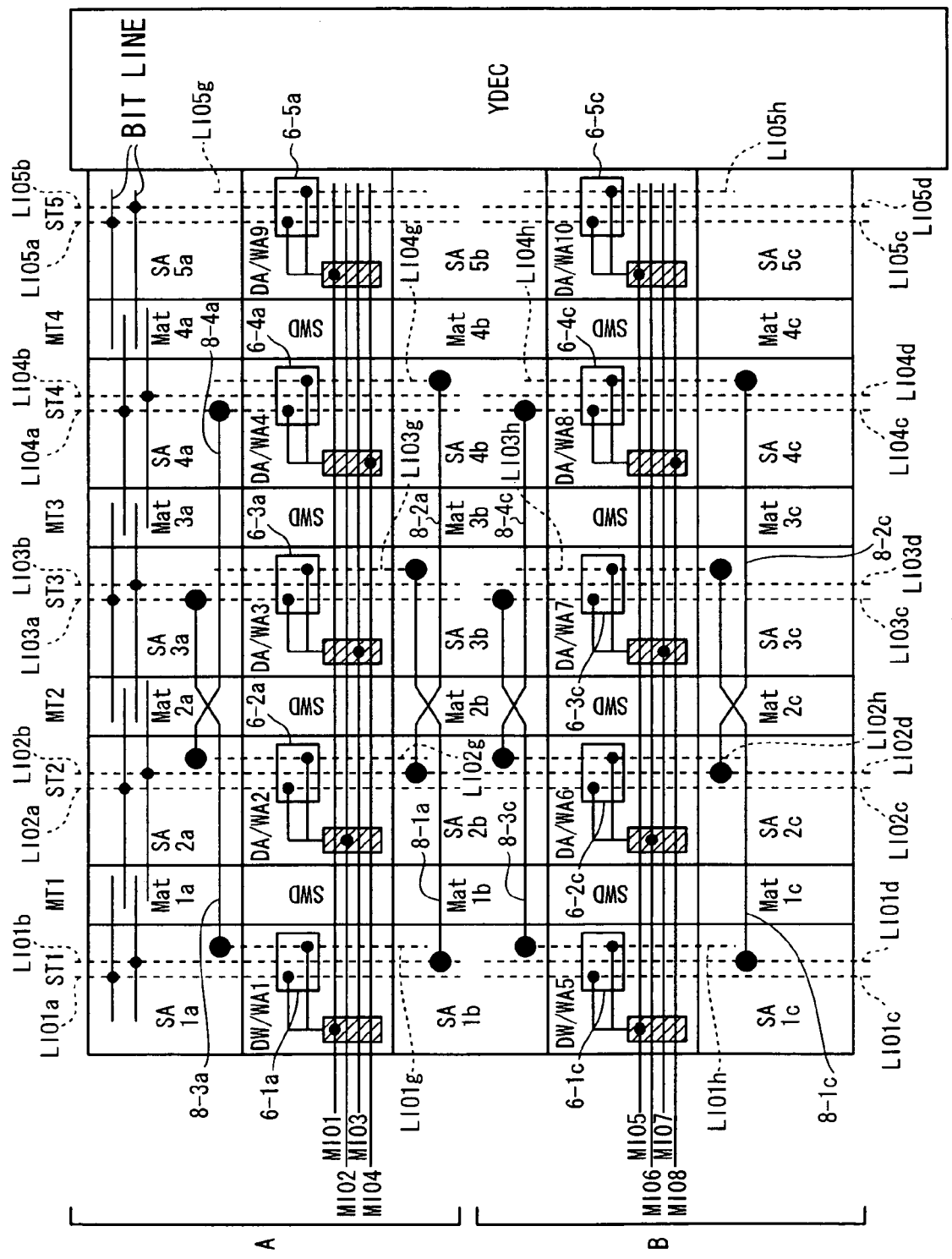
FIG. 3 illustrates a memory cell region of a semiconductor memory device according to a second embodiment of the present invention.

FIG. 3 is a block diagram illustrating the configuration of a semiconductor device according to a second embodiment of the present invention. Like reference numerals between FIGS. 1 and 3 denote like elements, and explanations thereof are omitted.

In the second embodiment, the LIO bypass wires 8-1a and 8-2a have the relationship of multi-level crossing with each other over a memory cell area of Mat2b where memory cells are provided. Similarly, the LIO bypass wires 8-3a and 8-4a have the relationship of multi-level crossing with each other over a memory cell area of Mat2a where memory cells are provided. The LIO bypass wires 8-1c and 8-2c have the relationship of multi-level crossing with each other in a memory cell area of Mat2c where memory cells are provided. The LIO bypass wires 8-3c and 8-4c have the relationship of multi-level crossing with each other over a memory cell area of Mat2b where memory cells are provided.

Thereby, in addition to the effects achieved by the semiconductor device according to the first embodiment, the semiconductor memory device according to the second embodiment can decrease bias in the effects of inter-wire capacity between the LIO bypass wires and other signal lines provided adjacent thereto, thereby equalizing the capacities among LIO bypass wires.

Third Embodiment

Figure 4:
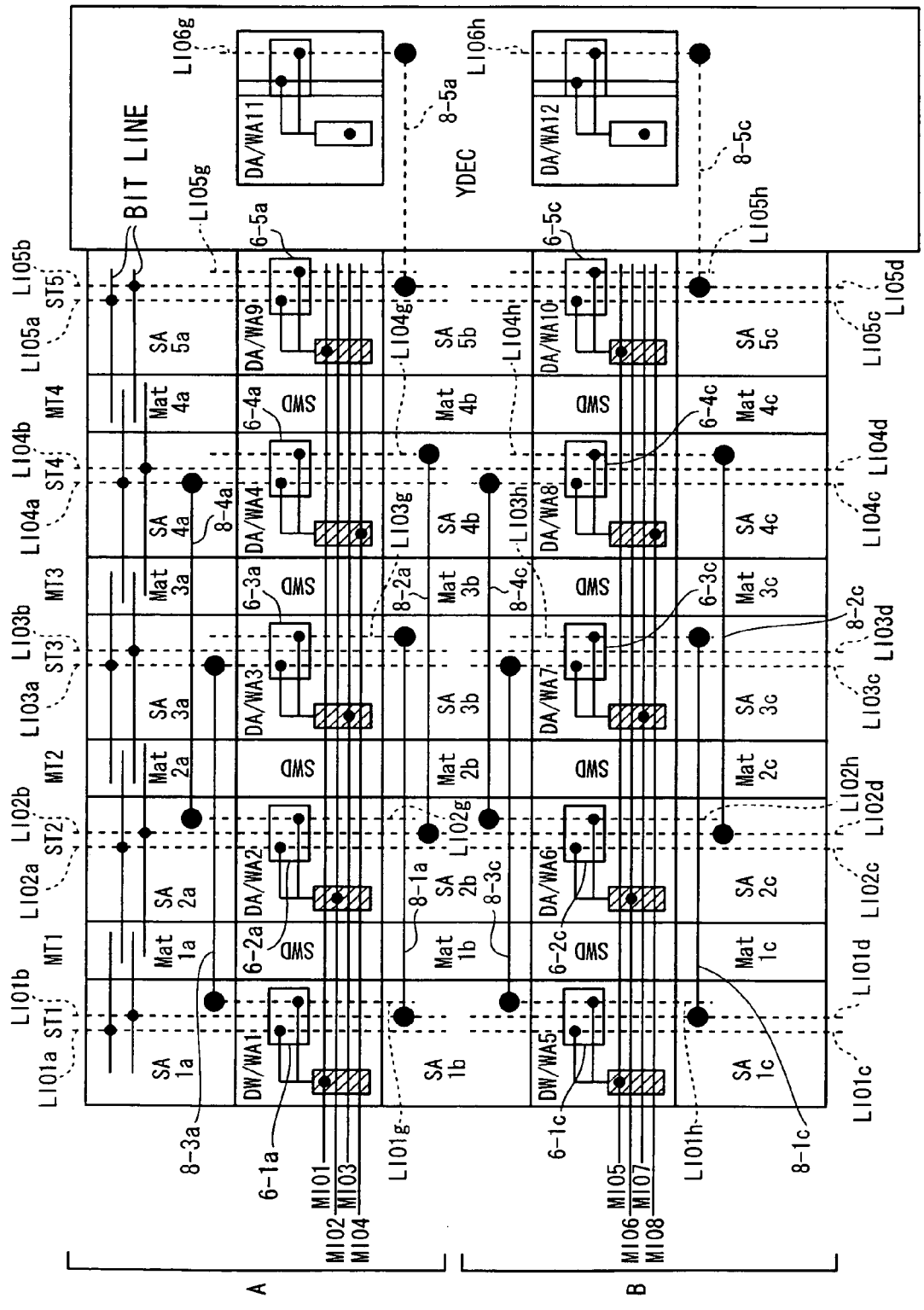
FIG. 4 illustrates a memory cell region of a semiconductor memory device according to a third embodiment of the present invention.

FIG. 4 illustrates the configuration of a semiconductor device according to a third embodiment of the present invention. Like reference numerals between FIGS. 1 and 4 denote like elements, and explanations thereof are omitted.

In the third embodiment, DA/WA11 and DA/WA12 having the same configuration as that of DA/WA included in the memory cell matrix are provided in the YDEC area since there is no ST in the memory cell matrix which is to be connected through LIO bypass wires to ST5 when MT4 is selected.

For this reason, LIO5b from SA5a is connected to LIO6g from DA/WA11 through an LIO bypass wire 8-5a. LIO5d from SA5c is connected to LIO6h from DA/WA12 through an LIO bypass wire 8-5c. DA/WA1 and DA/WA12 amplify inputs from LIO6g and LIO6h.

Thereby, in addition to the effects achieved by the semiconductor memory device according to the first embodiment, the semiconductor memory device according to the third embodiment can use the DA/WA provided in the YDEC even when there is no DA/WA included in the memory cell matrix to be connected through LIO bypass wires to LIOs connected to ST at the end of the memory region.

It is apparent that the present invention is not limited to the above embodiments, but may be modified and changed without departing from the scope and spirit of the invention.

What is claimed is:

1. A semiconductor memory device comprising:
   first and second memory mats;
   first and second local input output lines each coupled to the first memory mat via a corresponding one of first amplifier circuits;
   third and fourth local input output lines different from the first and second local input output lines, each of third and fourth local input output lines being coupled to the second memory mat via a corresponding one of second amplifier circuits;
   a third amplifier circuit coupled between the first local input output line and a first main input output line;
   a fourth amplifier circuit coupled between the third local input output line and a second main input output line different from the first main input output line; and
   a first switch coupled between the second and third local input output lines and connecting the second local input output line to the fourth amplifier circuit when the first memory mat is activated and the second memory mat is not activated.

2. The semiconductor memory device according to claim 1, further comprising a second switch coupled between the first and fourth local input output lines and connecting the fourth local input output line to the third amplifier circuit when the second memory mat is activated and the first memory mat is not activated.

3. The semiconductor memory device according to claim 1, wherein the first, second, third and fourth local input output lines are elongated along a first direction and the first and second main input output lines are elongated along a second direction substantially orthogonal to the first direction.

4. The semiconductor memory device according to claim 3, wherein the first memory mat and the second memory mat are arranged along the second direction.

5. The semiconductor memory device according to claim 3, wherein the first memory mat and the first amplifier circuit are arranged along the second direction and the second memory mat and the second amplifier circuit are arranged along the second direction.

6. The semiconductor memory device according to claim 3, wherein the first amplifier circuit and the third amplifier circuit are arranged along the first direction and the second amplifier circuit and the fourth amplifier circuit are arranged along the first direction.

7. The semiconductor memory device according to claim 3, wherein the first and second memory mats and the first and second amplifier circuits are arranged along the second direction in line.

8. The semiconductor memory device according to claim 1, further comprising a fifth and sixth local input output lines coupled to the first memory mat and the second memory mat via a corresponding one of fifth amplifier circuits, wherein the fifth amplifier circuits are activated when one of the first and second memory mat is activated.

9. The semiconductor memory device according to claim 1, wherein the fourth amplifier circuit is activated in response to at least an activation of the first memory mat.

10. A controlling method for a semiconductor memory device, comprising:
    activating a first memory mat without activating a second memory mat different from the first memory mat;
    activating a first amplifier circuit provided corresponding to the first memory mat;
    activating a second amplifier circuit provided corresponding to the first amplifier circuit to amplify one or ones of predetermined number of data from the first memory mat; and
    activating a fourth amplifier circuit provided corresponding to a third amplifier circuit which is provided corresponding to the second memory mat, the fourth amplifier circuit amplifying a remaining one or ones of the predetermined number of data from the first memory mat.

11. The controlling method according to claim 10, wherein the activating the fourth amplifier circuit is performed without activating the third amplifier circuit.

12. The controlling method according to claim 10, wherein the activating the first amplifier circuit includes amplifying the predetermined number of data from the first memory mat.

13. A device comprising:
    first, second and third regions arranged in line in a first direction, each of the first, second and third regions including first and second parts arranged in a second direction perpendicular to the first direction, the first part of each of the first, second and third regions including a plurality of sense amplifier circuits, and the second part of each of the first, second and third regions including a data amplifier circuit;

a fourth region arranged between the first and the second regions and including a third part that is sandwiched between the first parts of the first and the second regions and a fourth part that is sandwiched between the second parts of the first and second regions, and further including a plurality of first memory cells disposed in the third part thereof and a plurality of first driver circuits disposed in the fourth part thereof, each of the first memory cells being coupled to a corresponding one of the sense amplifier circuits of the first part of one of the first and the second regions, and each of the first driver circuits being coupled to corresponding ones of the first memory cells;

wherein one or ones of the sense amplifier circuits of the first part of the first region are configured to be coupled to the data amplifier circuit of the second part of the first region and remaining one or ones of the sense amplifier circuits of the first part of the first region are configured to be coupled to the data amplifier circuit of the second part of the third region.

14. The device according to claim 13, further comprising:
a first switching circuit coupled at one end thereof in common to the remaining one or ones of the sense amplifier circuits of the first part of the first region and at the other end thereof the data amplifier circuit of the second part of the third region.

15. The device according to claim 14, wherein the first switching circuit is disposed in the second part of the third region.

16. The device according to claim 13, further comprising:
a fifth region arranged between the second and the third regions and including a fifth part that is sandwiched between the first parts of the second and the third regions and a sixth part that is sandwiched between the second parts of the second and third regions, and further including a plurality of second memory cells disposed in the fifth part thereof and a plurality of second driver circuits disposed in the sixth part thereof, each of the second memory cells being coupled to a corresponding one of the sense amplifier circuits of the part of one of the second and the third regions, and each of the second driver circuits being coupled to corresponding ones of the second memory cells.

17. The device according to claim 13, wherein one or ones of the sense amplifier circuits of the first part of the third region are configured to be coupled to the data amplifier circuit of the second part of the third region and remaining one or ones of the sense amplifier circuits of the first part of the third region are configured to be coupled to the data amplifier circuit of the second part of the first region.

18. The device according to claim 13, further comprising:
a plurality of first input output lines elongated in the first direction, each of the first input output lines being coupled to a corresponding one of the data amplifier circuits of the second regions of the first, second and third regions.

* * * * *